(12) United States Patent
Milton

(10) Patent No.: US 6,633,201 B1
(45) Date of Patent: Oct. 14, 2003

(54) SYSTEM AND METHOD FOR DETERMINING FREQUENCY TOLERANCE WITHOUT A REFERENCE

(75) Inventor: Paul Spencer Milton, La Jolla, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 120 days.

(21) Appl. No.: 09/760,132

(22) Filed: Jan. 12, 2001

(51) Int. Cl.[7] ............................................... H03L 7/095
(52) U.S. Cl. ................... 331/1 A; 331/11; 331/DIG. 2; 327/156; 327/159; 375/376; 375/354; 375/375
(58) Field of Search ........................... 331/1 A, DIG. 2, 331/11; 375/354, 375, 376; 327/156, 159

(56) References Cited

U.S. PATENT DOCUMENTS

| 5,592,125 A | 1/1997 | Williams |
| 5,850,422 A | 12/1998 | Chen |
| 5,905,767 A | 5/1999 | Fujimura |
| 6,034,554 A | 3/2000 | Francis et al. |
| 6,081,572 A | 6/2000 | Filip |
| 6,320,469 B1 * | 11/2001 | Friedberg et al. ........... 331/1 A |

* cited by examiner

Primary Examiner—Arnold Kinkead
(74) Attorney, Agent, or Firm—Incaplaw; Terrance A. Meador

(57) ABSTRACT

A system and method have been provided for determining a frequency tolerance between a generated clock and an input data rate. The invention analyzes beatnotes, externally generated through a comparison of clock and input data rates, and an overflow count of the clock. The occurrence of overflow counts, without intervening beatnotes, indicates that the clock and data rate are close in frequency. The occurrence of beatnotes without intervening overflow counts indicates that the clock and data rates are not close in frequency. Hysteresis is built into the system, preventing the system from indicating an out-of-lock condition when the beatnotes immediate follow the an overflow count, or when the system monitors occasional beatnotes.

18 Claims, 6 Drawing Sheets

SYSTEM AND METHOD FOR DETERMINING FREQUENCY TOLERANCE WITHOUT A REFERENCE

BACKGROUND OF THE INVENTION

1. Field of the Invention

This invention relates generally to loop acquisition and, more particularly, to a system and method for determining the frequency tolerance of a synthesized signal without a frequency reference source.

2. Description of the Related Art

The use of oscillators and synthesized frequency sources are well known in communications. These frequencies are used in the generation of carrier signal and local oscillator signals, or used in the modulation and demodulation of information. The frequency tolerance of these signals is critical, and communications are degraded when the synthesized signal is out of tolerance. Conventionally, a frequency source, such as a crystal, that is highly stable with respect to temperature, initial calibration, and aging is used in the generation of the signals. Often the reference signal is baseband and must be translated up in frequency for use in the communication circuitry.

However, there are problems with the use of reference frequency circuits. The reference circuits use valuable board real estate and consume power, that may be critical in portable or battery operated equipment. Further, the parts can be expensive, with a premium paid for increased accuracy. In some applications the reference circuitry must be warmed up. If the warm up time is significant, a significant amount of data can be lost before the required frequency accuracy is obtained. Further, the additional parts count of the reference circuit increases the probability of circuit failure.

In some applications, the communication carrier frequency or modulation frequency may be variable, so the reference circuit must provide a plurality of reference frequencies. Thus, additional crystals may be required, or selectable loop dividers.

A so-called Bang-Bang phase detector can be used to acquire an input data signal without the need of a reference signal. However, the Bang-Bang phase detector cannot control the oscillator frequency with a fine degree of resolution. For example, it is difficult to use a Bang-Bang phase detector to control an oscillator sufficiently to meet synchronous optical network (SONET) standards. The accuracy of the oscillator remains uncertain unless a frequency reference is used.

It would be advantageous if accurate oscillator or clock frequencies could be generated without a reference frequency.

It would be advantageous if the oscillator frequency needed to receive communications could be derived from the received carrier signal or data signal.

SUMMARY OF THE INVENTION

Accordingly, the invention provides a system and method for determining when the oscillator or voltage controlled oscillator (VCO) clock frequency and the input date rate are within a specified frequency tolerance, without the use of a reference clock.

The method comprises: measuring the frequency of an oscillator signal; measuring the difference between the oscillator signal frequency and a data signal rate; reinitializing the measurement of the oscillator signal frequency in response to the frequency difference beatnote, or reset signal, between the oscillator and data signals; and, determining a sufficient tolerance (lock) between the oscillator frequency and data signal rate, in response to completing the measurement of the oscillator signal frequency.

More specifically, the oscillator frequency is measured by counting cycles of the oscillator signal, and a lock is determined between the oscillator signal frequency and data signal rate by counting a predetermined first number of cycles without an intervening beatnote occurrence. When a beatnote occurs, the count of the oscillator signal cycles is reinitialized.

Once lock is determined, the method further comprises: determining an insufficient tolerance (loss of lock) between the oscillator signal frequency and the data signal rate in response to generating reset signals. However, for reasons of hysteresis, at least a predetermined second number of consecutive reset signals must be counted, without an intervening count of the first number of oscillator cycles. That is, without an intervening first number count.

Additional details of the frequency tolerance determination method, and a system for determining frequency tolerance without the use of a reference frequency are presented below.

DETAILED DESCRIPTION OF THE PREFERRED EMBODIMENTS

Figure 1:
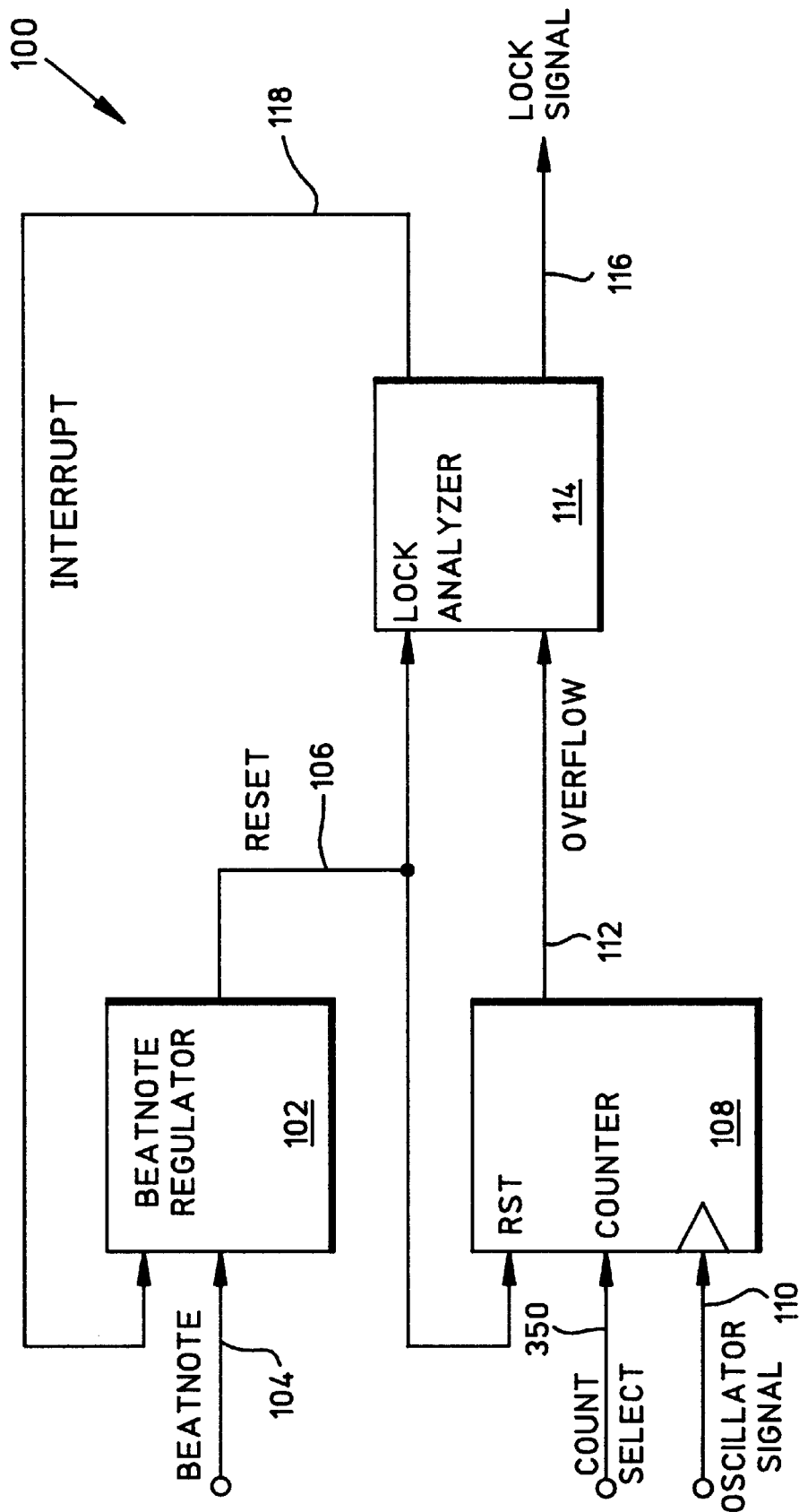
FIG. 1 illustrates the present invention system for determining frequency tolerance.

FIG. 1 illustrates the present invention system for determining frequency tolerance. The system 100 comprises a beatnote regulator 102 having a first input on line 104 to accept a beatnote signal. The beatnote signal has a frequency equal to the difference between input frequencies. For example, between an oscillator signal frequency and a data signal rate. The beatnote regulator has an output on line 106 to provide a reset signal in response to the beatnote signal.

A counter 108 has a first input to accept and count cycles of the oscillator signal on line 110. The counter 108 has an output on line 112 to provide an overflow signal, or most significant bit (MSB) in response to meeting a first count. The counter has a second input connected to the beatnote regulator output on line 106 to reinitialize the count.

A lock analyzer 114 has a first input connected to the output of the beatnote regulator on line 106 and a second input connected to the output of the counter on line 112. The lock analyzer 114 analyzes the reset and overflow signals to supply a lock signal at a first output on line 116 when the oscillator and data signal frequencies are within a sufficient tolerance.

In normal operation, the lock analyzer 114 generates a lock signal in response to receiving a single overflow signal. The lock analyzer 114 ceases to generate the lock signal in response to receiving a predetermined number of reset signals, subsequent to the initial lock signal.

The lock analyzer 114 also has a second output to supply an interrupt signal on line 118 in response to generating an initial lock signal. The beatnote regulator 102 has a second input connected to the second output of the lock analyzer on line 118 to accept the interrupt signal. The beatnote regulator 102 interrupts the supply of reset signals on line 106 that are generated in response to the beatnote signal, when the interrupt signal has been received. The lock analyzer 114 ceases to supply the interrupt signal on line 118 in response to receiving an overflow signal on line 112, subsequent to the generation of the initial lock signal. Thus, the system 100 ignores the reception of beatnotes in the time period between the generation of an initial lock signal and the subsequent lock signal. This feature is useful when the system 100 uses the lock signal to perform functions that may be momentarily unstable, or that temporarily generate beatnote signals.

More specifically, the beatnote regulator 102 generates a single reset signal in response to receiving the interrupt signal, or the initiation of the interrupt signal. This reset signal is used to reinitialize the counter 108. After generating the next overflow, which in turn causes the subsequent lock signal, the beatnote regulator 102 generates another reset signal in response to the cessation of the interrupt signal. The counter 114 is reinitialized for normal operation where beatnote generated reset signals are once more analyzed. That is, the counter 114 is reinitialized in response to the reset signals generated by the interrupt signal.

Figure 2:
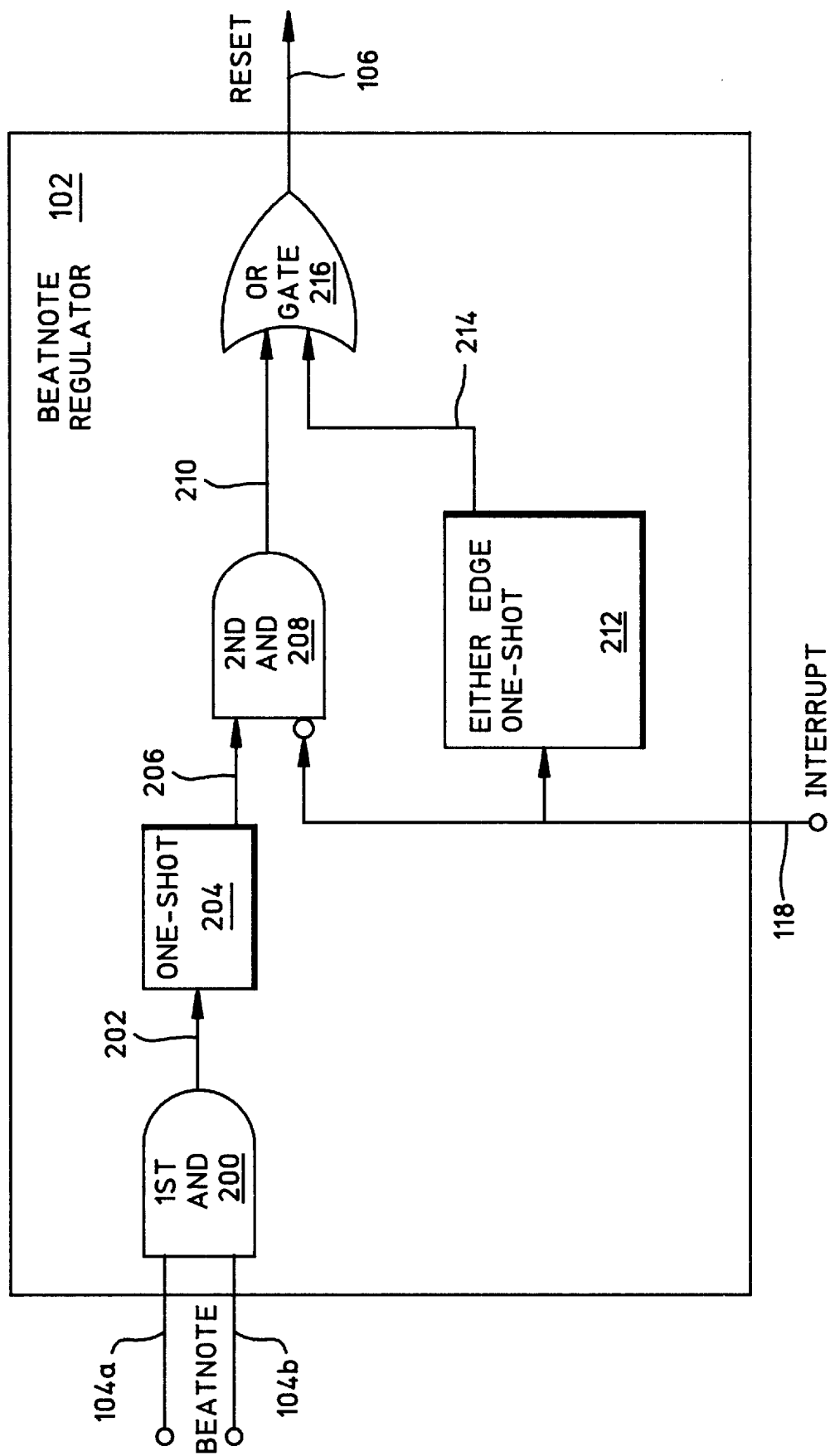
FIG. 2 is a more detailed depiction of the beatnote regulator of FIG. 1.

FIG. 2 is a more detailed depiction of the beatnote regulator 102 of FIG. 1. In some aspects of the invention, the beatnote signal on line 104 includes a first beatnote signal on line 104a responsive to the oscillator signal frequency being higher than the data signal rate. A second beatnote signal on line 104b is responsive to the oscillator signal frequency being lower than the data signal rate. A first AND gate 200 has a first input on line 104a to receive the first beatnote signal, and a second input on line 104b to receive the second beatnote signal. The first AND gate 200 has an output on line 202 that provides the ANDed function of the two input signals. Typically, only one line will have beatnotes to communicate at any particular time, while the other line remains high. The ANDed beatnotes are passed on the line 202.

A rising edge one-shot 204 has an input on line 202 connected to the first AND gate 200 output. The rising edge one-shot 204 creates a pulse supplied at an output on line 206, in response to each received beatnote. A second AND gate 208 has a first input connected to the second output of the lock analyzer to accept and invert the interrupt signal, a second input connected to the output of the rising edge one-shot 204, and an output on line 210 to supply the reset signal. In some aspects of the invention (not shown) a degliching circuit may be used between the first AND gate 200 and the rising edge one-shot 204.

An either edge one-shot 212 has an input connected to the second output of the lock analyzer to accept the interrupt signal on line 118. The either edge one-shot 212 has an output on line 214 to supply a signal in response to the initiation of the interrupt signal and the cessation of the interrupt signal. An OR gate 216 has a first input connected to the output of the either edge one-shot 212 on line 214, a second input connected to the output of the second AND gate on line 210, and an output connected to the second input of the counter on line 106.

Although the beatnote regulator 102 has been depicted as a specific combination of logic elements, the present invention is not limited to depicted combination of elements or signal polarities. An equivalent circuit could be easily designed to generate reset pulses in response to equivalent stimuli.

Figure 3:
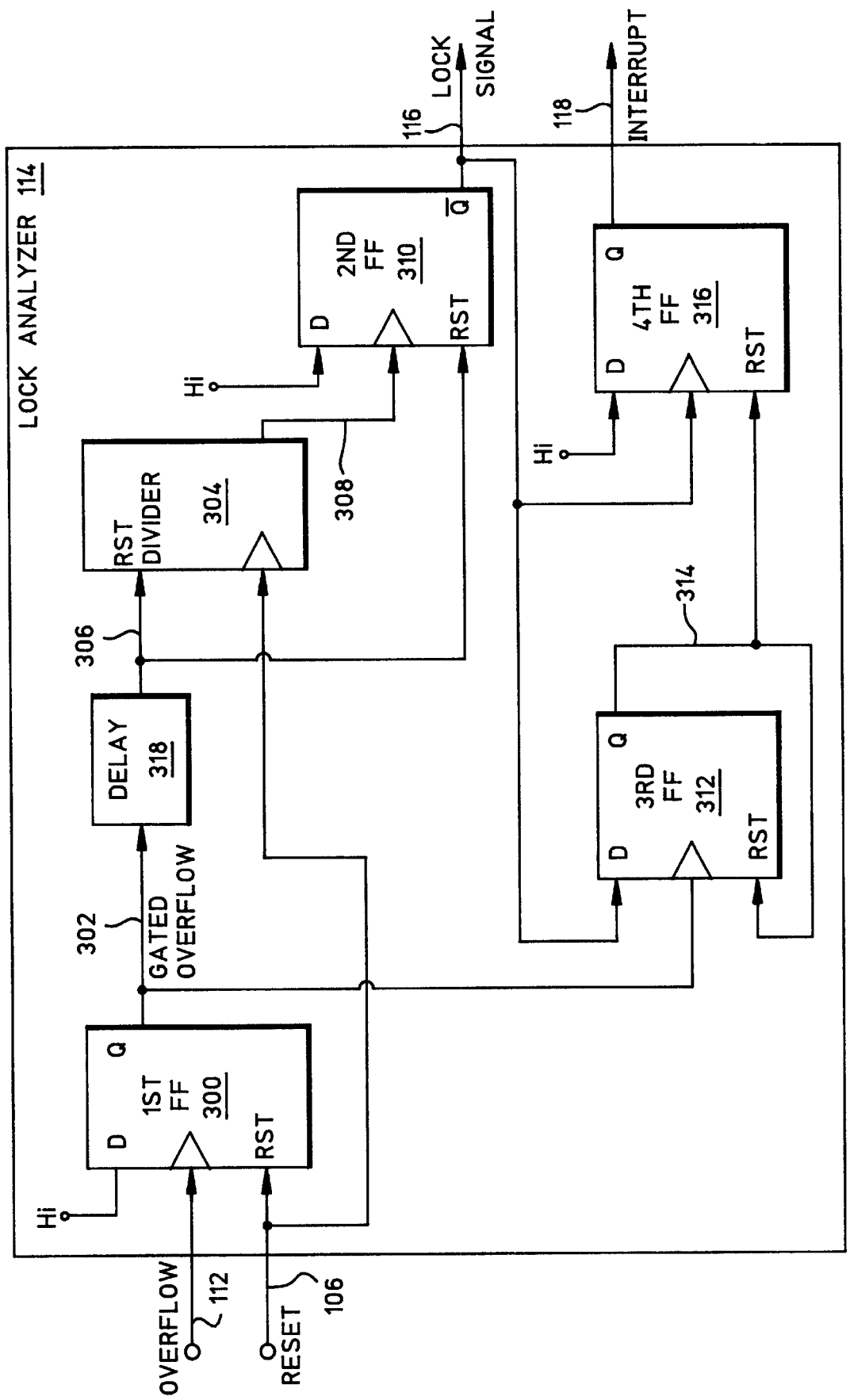
FIG. 3 is a more detailed depiction of the lock analyzer of FIG. 1.

FIG. 3 is a more detailed depiction of the lock analyzer 114 of FIG. 1. The lock analyzer further comprises a first flip-flop 300 having a clock input connected to the counter output on line 112. A reset input of the first flip-flop 300 is connected to the beatnote regulator output on line 106. The first flip-flop 300 has an output on line 302 to supply a saved, or gated overflow signal. Note that the data input is tied to a logic high signal and the output is derived from the "Q" output of the first flip-flop in this particular configuration of the invention.

A divider 304 has a clock input connected to the output of the beatnote regulator on line 106 and a reset input connected to the output of the first flip-flop on line 306. The divider 304 has an output on line 308 to supply a divided reset signal. In some aspects of the invention, the divider 304 is a divide-by-four, and the reset signal on line 106 is divided by four.

A second flip-flop 310 has a clock input connected to the divider output on line 308, a reset input connected to the output of the first flip-flop on line 306, and an output to supply the lock signal on line 116. The data input of the second flip-flop 310 is tied to a logic high.

The lock analyzer 114 includes further elements to enable the interrupt function. A third flip-flop 312 has a data input connected to the output of the second flip-flop on line 116, a clock input connected to the output of the first flip-flop on line 302, and a reset input. The third flip-flop 312 has an output on line 314 connected to the reset input, to supply an interrupt reset signal.

A fourth flip-flop 316 has a clock input connected to the output of the second flip-flop on line 116, a reset input connected to the output of the third flip-flop on line 314, and an output connected to the second input of the beatnote regulator on line 118 to supply the interrupt signal. Note that the data input is tied to a logic high.

In some aspects of the invention, the second flip-flop 310 has a first propagation delay for supplying an output responsive to resetting the flip-flop. Then, the lock analyzer 114 further comprises a delay element 318, with a second propagation delay, and an input connected to the output of the first flip-flop on line 302. The delay 318 has an output connected to the reset input of the divider 304 and the reset input of the second flip-flop 310 on line 306. Further, the third flip-flop 312 has a data input hold-time that is less than the combination of the first and second propagation delays.

Alternately, the delay element 318 can be eliminated if the propagation of the first flip-flop output signal is delayed sufficiently through second flip-flop 310. That is, if the third flip-flop hold-time is less than the propagation delay through the second flip-flop. However achieved, the propagation delays are important to assure that the third flip-flop 312 is clocked with a "0", to prevent the generation of an interrupt reset signal on line 314.

Likewise, the first flip-flop 300 has a third propagation delay for supplying an output responsive to resetting the flip-flop in response to reset signals on line 106. Then, the divider 304 has a clock pulse processing delay that is less than the combination of the second and third propagation delays. Alternately, the same effect is achieved if the circuit is designed so that the first flip-flop 300 has propagation delay that exceeds the divider clock processing delay. This timing concern insures that the reset signal on line 106 is ignored by the divider 304 (if line 302 is high), before the first flip-flop 300 is reset.

Returning to FIG. 1, in some aspects of the invention, the counter 108 has a third input on line 350 to accept commands selecting the first count. Then, the lock analyzer 114 supplies a lock signal with a relaxed tolerance of frequency differences between the oscillator and data signals in response to decreasing the value of the first count. Alternately stated, if the first count is decreased, then it is more likely that an overflow signal will be generated, in turn generating a lock signal, before a reset signal is received. Since it is easier to generate lock signals with a smaller first count, the system has a greater tolerance of beatnotes and, therefore, of frequency differences between the oscillator frequency and data signal rate. Likewise, when the first count is increased, the frequency tolerance is tightened.

Figure 4:
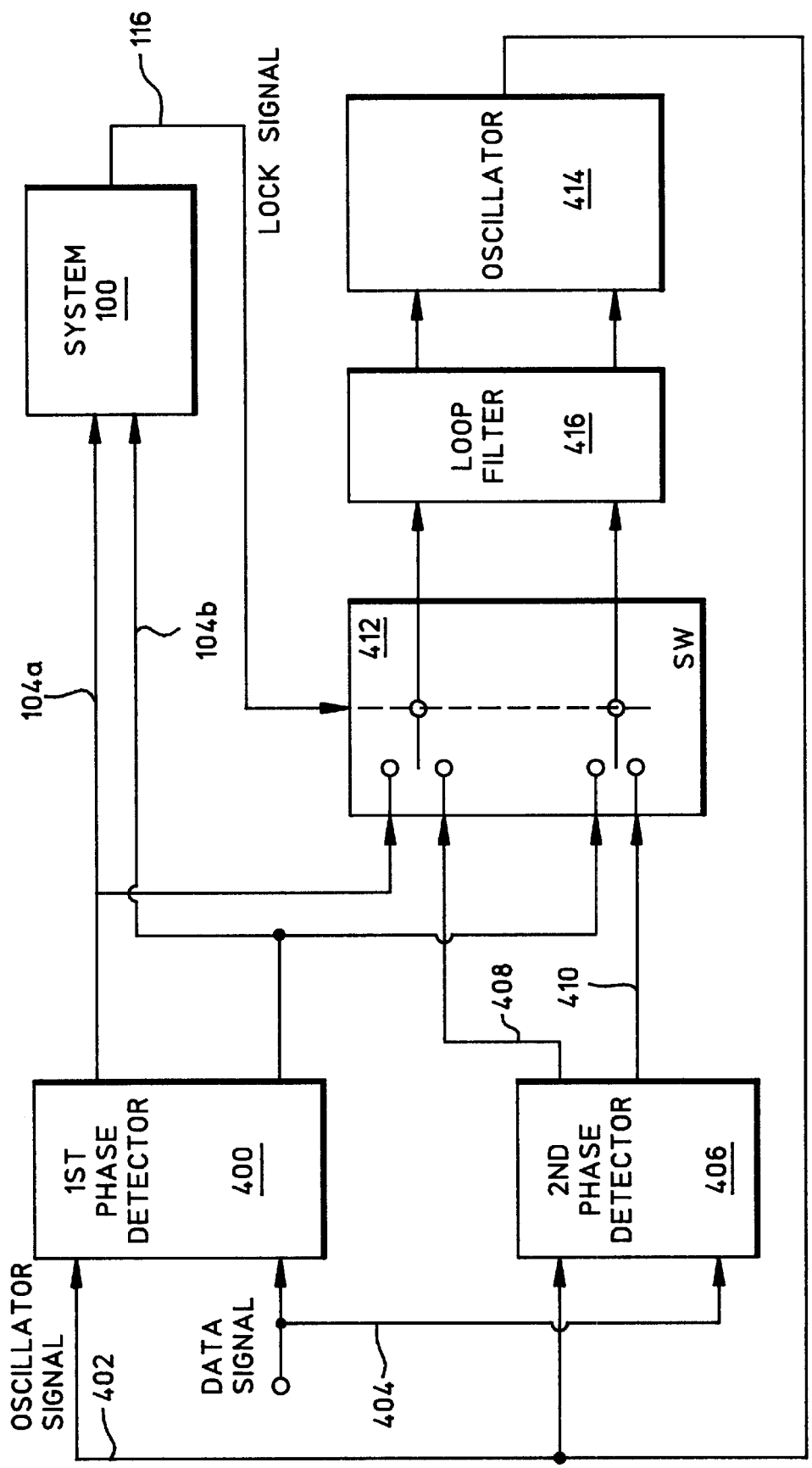
FIG. 4 is a schematic block diagram illustrating an exemplary use of the system of FIG. 1; and FIGS. (5a, 5b) is a flowchart illustrating the present invention method for determining frequency tolerance.

FIG. 4 is a schematic block diagram illustrating an exemplary use of the system 100 of FIG. 1. A first phase detector 400 has a first input on line 402 to accept the oscillator signal, a second input on line 404 to accept the data signal, a first output to supply the first beatnote signal on line 104a, and a second output to supply the second beatnote signal on line 104b. A second phase detector 406 also has inputs connected to receive the oscillator signal and data signal, and has differential outputs on lines 408 and 410. A Bang-Bang frequency phase detector provides a beatnote signal that is responsive to the frequency of the inputs, and it can be used as the first phase detector 400 to lock a loop or control the frequency of an oscillator. The data signal does not have a frequency per se, however, the information is clocked at a rate which can be thought of as a frequency for the purpose of the present analysis.

A switch 412 has a control input connected to the first output of the lock analyzer on line 116 to receive the lock signal. The switch 412 has data inputs connected to the first phase detector 400 on lines 104a and 104b, and to the second phase detector 406 on lines 408 and 410. The switch 412 selects the second phase detector 406 for use in response to the lock signal on line 116. The switch 412 selects the first phase detector 400 for use in response to the cessation of the lock signal.

In some aspects, the second phase detector 406 is a Hogge phase detector. Then, the circuit of FIG. 4 uses the Bang-Bang 400 and Hogge 406 phase detectors to recover a clock signal from an input data signal. This recovery is accomplished without a reference frequency, and can be designed to meet SONET tolerance standards. The Bang-Bang frequency detector 400 is used in acquisition. When the oscillator 414 frequency is close enough (in frequency) to the data rate, control of the loop is passed from the Bang-Bang frequency detector 400 to the Hogge detector 406 for improved frequency/phase tracking.

Additional details of this use of the system 100 for selecting a phase detector can be found in copending patent application Ser. No. 09/667,264, entitled Dual-Loop System and Method for Frequency Acquisition and Tracking, invented by Bruce Coy, filed on Sep. 22, 2000, and assigned to the same assignee as the instant invention. However, the present invention is not limited to merely this specific implementation.

A more functional explanation of system 100 follows that requires the simultaneous reference to FIGS. 1 through 4. If the frequency difference between the oscillator signal and the date rate is large, resets occur before the counter 108 can overflow. Likewise, if the frequency difference is within the tolerance of "lock", the counter 108 overflows before a reset signal is generated. If the counter 108 overflows, an overflow state is triggered and lock is indicated. Once lock is indicated, the lock signal on line 116 cannot change for a time period equal to one entire counter cycle (the first count). After this wait, "lock" can be lost only with four consecutive non-overflow resets (assuming the divider is divide-by-four). This event occurs when the oscillator frequency and the data rate difference are consistently outside of the "lock" tolerance.

The lock analysis circuit 114 can start in any internal state and will work itself out within four rising beatnote edges. Assuming the difference in frequency between the oscillator signal and the data rate is more than the "lock" tolerance, the lock signal on line 116, the gated overflow signal on line 302, and the interrupt signal on line 118 are low.

The first AND gate 200 monitors rising edges of the beatnote signals on lines 104a and 104b. Since the interrupt signal is low, whenever a rising edge occurs a reset signal (high) is generated on line 106. Assuming that the reset signal is generated before the counter overflows, the gated overflow signal on line 302 is reset before clocking in a "1", and lock signal on line 116 does not go high. The reset signal also reinitializes the counter 108 and increments the count at divider 304. When the divider 304 reaches "4", the second flip-flop 310 clocks in a "1".

As the frequency of the reset signal on line 106 decreases, such that the counter 108 can generate an overflow signal, the lock signal on line 116 goes high. When the gated overflow signal on line 302 pulses high, long enough to reset the second flip-flop 310, the lock signal on line 116 goes high. At the same time, the divider 304 is reset.

Once the lock signal goes high, the interrupt signal on line 118 also goes high. This flag turns "off" the second AND gate 208, but the action of the either edge one-shot 212, which generates a pulse in response to either a low or high signal, causes a reset signal, and the counter 108 is reset. The beatnote regulator 102 ignores beatnotes during the time the interrupt signal is high. In the context of FIG. 4, this transition could occur as the switch 412 changes from the first phase detector 400 to the second 406. The counter 108 is reset so that beatnotes are ignored for the entire 2048 count (assuming the first count equals 2048). When the counter 108 overflows, with the lock signal already high, the third flip-flop 312 is clocked, the fourth flip-flop 316 is reset, and the interrupt signal goes low. The falling edge on the interrupt signal reactivates the second AND gate 208, and the either edge one-shot 212 causes the counter 108 to reset. Thus, a full count (2048) will occur before the MSB goes high. The divider is also reset, to ensure that four consecutive non-overflow counts are required to lose lock.

In some aspects of the invention, the selectable phase detector circuit of FIG. 4 has a 488 parts per million (PPM) tolerance specification. Since any beatnote period over 2048 count indicates 488 PPM frequency difference, or less, between the data rate and the oscillator, it is not desirable to increment the divider 304 when a beatnote reset occurs, after the counter has overflowed. Therefore, it is important that (delayed) gated overflow signal on line 306 is held high and the divider 304 is held in reset, once the counter 108 has reached 2048.

Since there is no limit to the period of beatnotes on lines 104a and 104b, an overflow indicator must be used. Also, since a beatnote occurring after a counter overflow should not result in a loss of lock, the divider 304 must be held in reset despite the occurrence of the reset signal on line 106.

An "illegal" initial condition logic circuit can be used to remove the system 100 from the state in which the interrupt signal on line 118 is high and the lock signal on line 116 is not high. In this situation the fourth flip-flop 316 will never be reset. When the counter 108 will overflows, the lock signal remains high, and stays high forever because the interrupt signal is high. In some aspects of the invention (not shown), a simple AND gate has one input connected to accept the interrupt signal on line 118, a second input to accept an inverted lock signal, and an output to feed an OR gate. The other input of the OR gate is connected to line 314. The OR output is connected to reset inputs (line 314) of the third and fourth flip-flops 312/316. If the system 100 starts up in the interrupt and not locked state, the circuit will go into the not interrupt and not locked state.

The following is a case where four consecutive beatnotes, with a period less than 2048 oscillator cycles, cause the system 100 to lose lock. The first beatnote period is 2052 cycles long and all subsequent beatnote periods are 2045 cycles long.

| VCO CLOCKS | |
|---|---|
| 0 | reset occurs and counter is set to 0 |
| 2048 | counter overflows and rolls back to 0 |
| 4 | reset, counter is set to 0 (divider not incremented) |
| 2045 | reset occurs and counter is set to 0 (divider = 1) |
| 2045 | reset occurs and counter is set to 0 (divider = 2) |
| 2045 | reset occurs and counter is set to 0 (divider = 3) |
| 2045 | reset occurs and counter is set to 0 (divider = 4) |

The system is out of lock after 4 beatnote periods that are less than 2048 oscillator cycles long.

Figure 5A:
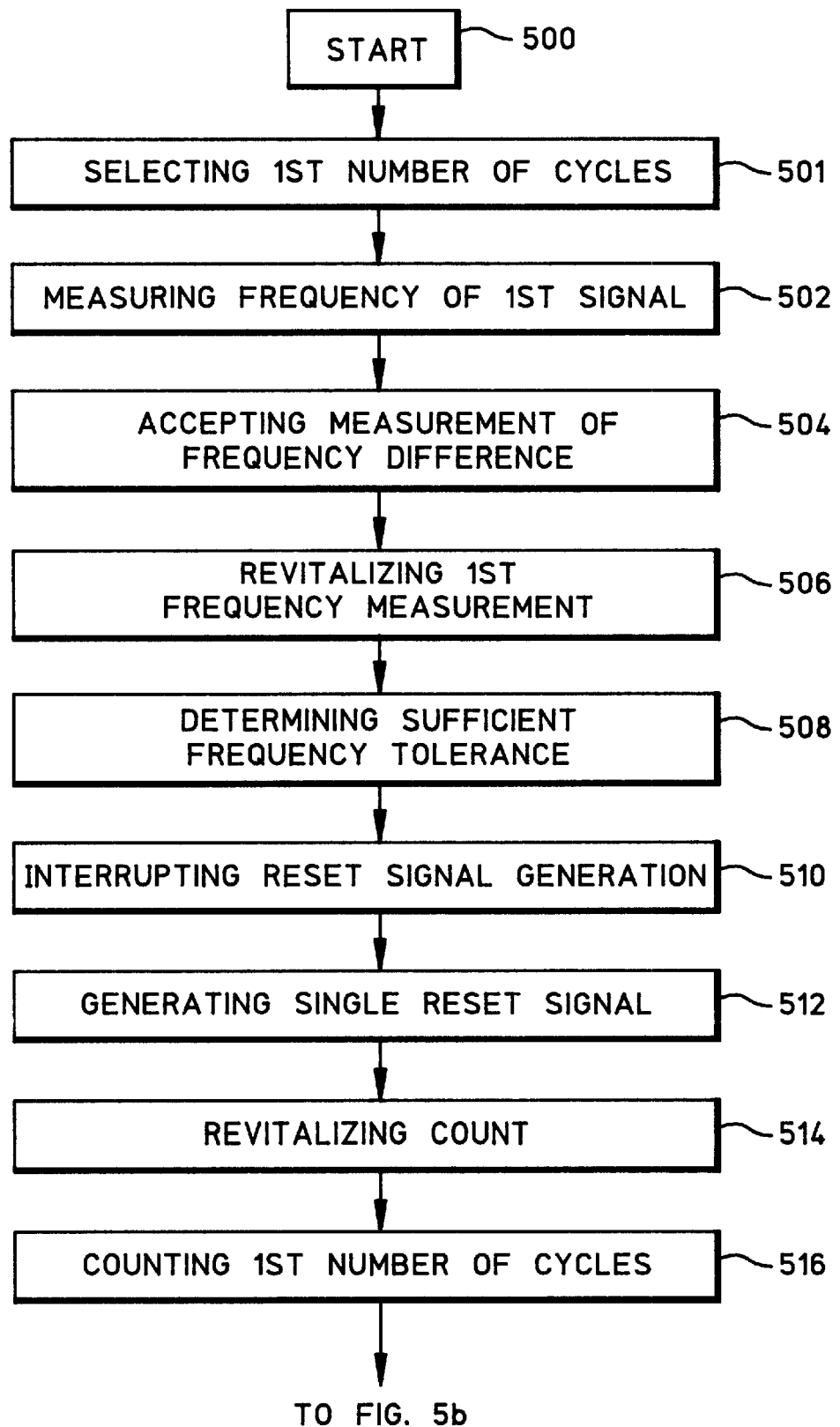
Figure 5B:
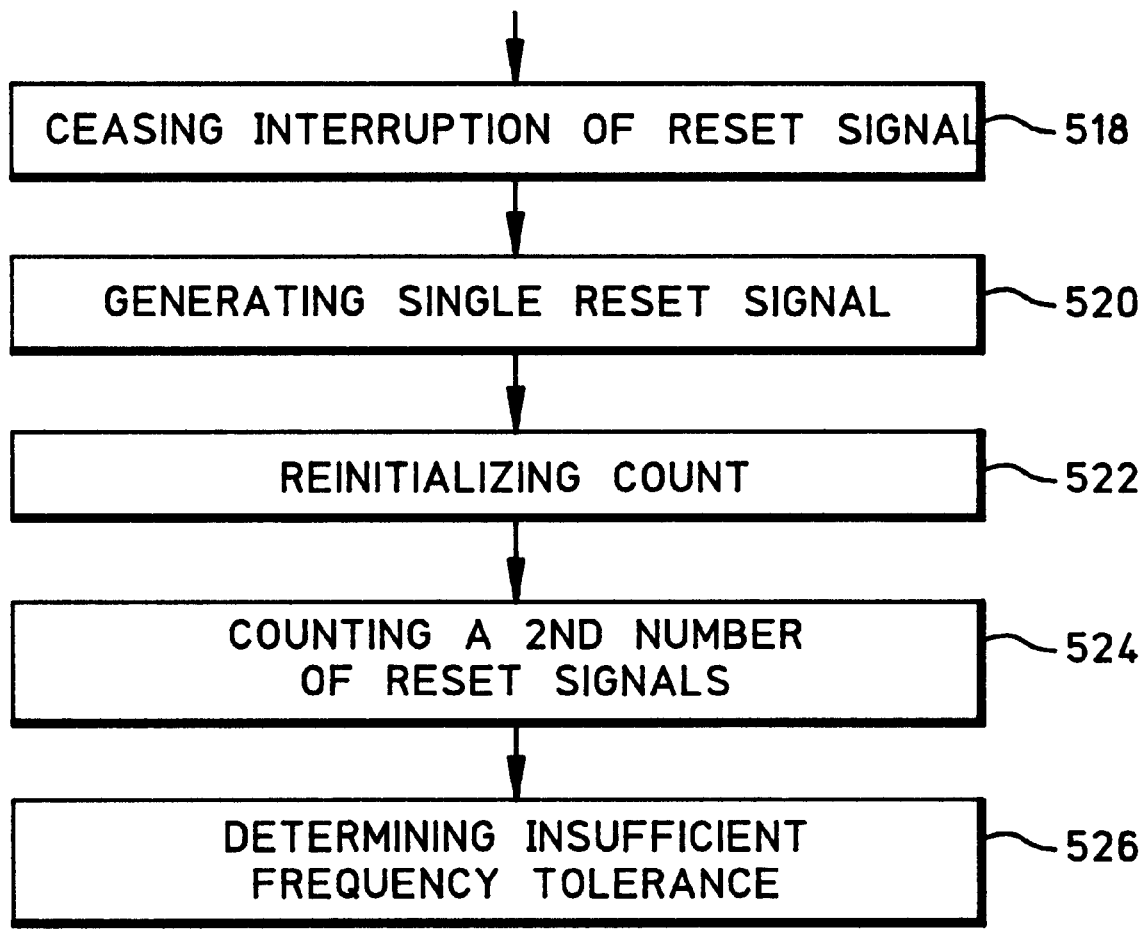

FIG. 5 is a flowchart illustrating the present invention method for determining-frequency tolerance. Although the method is depicted as a sequence of numbered steps for clarity, no order should be inferred from the numbering unless explicitly stated. The method begins at Step 500. Step 502 measures the frequency of a first signal. Step 504 accepts a measurement of the difference in frequency between the first signal and a second signal. Step 506 reinitializes the measurement of the first signal frequency in response to the frequency difference between the first and second signals. Step 508 determines a sufficient tolerance between the first and second signal frequencies in response to completing the measurement of the first signal frequency.

Measuring the frequency of the first signal in Step 502 typically includes counting cycles of the first signal. Then, determining a sufficient tolerance between the first and second signal frequencies in response to completing the measurement of the first signal frequency in Step 508 includes counting a predetermined first number of cycles, or more than the first number of cycles, to obtain a first count.

Reinitializing the measurement of the first signal frequency in response to the frequency difference between the first and second signals in Step 506 includes reinitializing the count of the first signal cycles.

In some aspects of the invention, the second signal is a data signal with a data rate. Then, accepting a measurement of the difference in frequency between the first signal and a second signal in Step 504 includes generating a reset signal having a frequency that is the absolute difference in frequency between the first signal frequency and second signal data rate. Reinitializing the count of the first signal cycles in Step 506 includes restarting the count at zero in response to the reset signal.

Following the determination of a sufficient tolerance between the first and second signal frequencies in Step 508, Step 510 interrupts the generation of the reset signal. Following the interruption of the generation of the reset signal in Step 510, Step 512 generates a single reset signal. Step 514 reinitializes the count of the first signal cycles in response to the reset signal. Step 516 counts a first number of first signal cycles. Step 518 ceases the interruption of the reset signal in response counting the first number of cycles. Following the cessation of the interruption of the reset signal in Step 518, Step 520 generates a single reset signal. Step 522 reinitializes the count of the first signal cycles in response to the reset signal.

The method includes the further steps. Step 524 counts at least a predetermined second number of reset signals without an intervening first count. Step 526 determines an insufficient tolerance between the first and second signal frequencies in response to generating reset signals. More specifically, determining an insufficient tolerance between the first and second signal frequencies in response to generating reset signals in Step 526 includes counting the second number of (consecutive) reset signals. Reset signals are considered to be consecutively generated if they occur without an intervening first signal cycle first number count (Step 508).

In some aspects of the invention, counting at least a second number of (consecutive) reset signals in Step 526 includes disregarding an initial reset signal, subsequent to counting a first number of first signal cycles (the first count).

In some aspects of the invention, an oscillator, data signal, and a first phase detector are supplied. Then, measuring the frequency of a first signal in Step 502 includes measuring the frequency of the oscillator signal. Accepting the measurement of the difference in frequency between the first signal and a second signal in Step 504 includes the first phase detector measuring the frequency difference between the oscillator signal frequency and the data signal rate.

In other aspects of the invention, a system, using a selectable first and second phase detector, is supplied, as shown in FIG. 4. Then, in response to determining a sufficient frequency tolerance in Step 508, Step 509 selects the second phase detector for use in the system. In response to determining an insufficient frequency tolerance in Step 524, Step 526 selects the first phase detector for use in the system.

In some aspects of the invention a further step, Step 501 selects the first number of cycles of first signals to be counted. Then, determining a sufficient tolerance between the first and second signal frequencies in Step 508 includes tightening the tolerance in response to selecting a larger first number of cycles.

A system and method have been provided for determining a frequency tolerance between input frequencies without the use of a reference frequency. The invention compares externally generated beatnotes to an overflow count generated by the clock. Although a specific example is given of using the invention to select between phase detectors, and the generation of a oscillator frequency, the invention is applicable to other types of frequency or loop analysis. Other variations and embodiments of the invention will occur to those skilled in the art.

I claim:

1. A method for determining frequency tolerance, the method comprising:

measuring the frequency of a first signal, wherein measuring the frequency of the first signal includes counting cycles of the first signal;

accepting a measurement of a difference in frequency between the first signal and a second signal with a data rate;

reinitializing the measurement of the frequency of the first signal in response to the difference, wherein reinitializing the measurement of the frequency of the first signal includes reinitializing counting cycles of the first signal; and determining a sufficient tolerance between the first and second signal frequencies in response to completing the measurement of the frequency of the first signal, wherein determining a sufficient tolerance between the first and second signal frequencies includes counting to more than a predetermined first number of cycles to obtain a first count;

wherein accepting the measurement of the difference in frequency between the first signal and the second signal includes generating a reset signal having a frequency that is the absolute difference in frequency between the first signal frequency and second signal data rate;

and wherein reinitializing counting cycles of the first signal includes restarting the count at zero in response to the reset signal.

2. The method of claim 1 further comprising:

determining an insufficient tolerance between the first and second signal frequencies in response to generating reset signals.

3. The method of claim 1 further comprising:

counting at least a predetermined number of reset signals without an intervening first count; and wherein determining an insufficient tolerance between the first and second signal frequencies in response to generating reset signals includes determining an insufficient tolerance in response to counting the predetermined number of reset signals.

4. The method of claim 3 wherein counting at least the predetermined number of reset signals includes disregarding an initial reset signal, subsequent to counting the predetermined first number of cycles.

5. A system for determining frequency tolerance, the system comprising:

a beatnote regulator having a first input to accept a beatnote signal having a frequency equal to the difference between an oscillator signal frequency and a data signal rate, and an output to provide a reset signal in response to the beatnote signal;

a counter having a first input to accept and count cycles of the oscillator signal, the counter having an output to provide an overflow signal in response to meeting a first count, and a second input connected to the beatnote regulator output to reinitialize the counter; and a lock analyzer having a first input connected to the output of the beatnote regulator and a second input connected to the output of the counter, the lock analyzer analyzing the reset and overflow signals to supply a lock signal at a first output when the oscillator and data signal frequencies are within a sufficient tolerance.

6. The system of claim 5 wherein the lock analyzer has a second output to supply an interrupt signal in response to generating an initial lock signal;

wherein the beatnote regulator has a second input connected to the second output of the lock analyzer to accept the interrupt signal, the beatnote regulator interrupting the supply of reset signals responsive to the beatnote signal; and wherein the lock analyzer ceases to supply the interrupt signal in response to receiving an overflow signal, subsequent to the generation of the initial lock signal.

7. The system of claim 6 wherein the beatnote regulator generates a reset signal in response to receiving the interrupt signal, and wherein the beatnote regulator generates a reset signal in response to the cessation of the interrupt signal; and wherein the counter is reinitialized in response to the reset signals generated by the interrupt signal.

8. The system of claim 7 wherein the lock analyzer generates a lock signal in response to receiving an initial overflow signal; and wherein the lock analyzer ceases to generate the lock signal in response to receiving a predetermined number of reset signals, subsequent to the initial lock signal.

9. The system of claim 8 in which the beatnote signal includes a first beatnote signal responsive to the oscillator signal frequency being higher than the data signal rate, and a second beatnote signal responsive to the oscillator signal frequency being lower than the data signal rate;

wherein the beatnote regulator further comprises:

a first AND gate having a first input to receive the first beatnote signal, a second input to receive the second beatnote signal, and an output;

a rising edge one-shot having an input connected to the first AND gate output and an output; and a second AND gate having a first input connected to the second output of the lock analyzer to accept the interrupt signal, a second input connected to the output of the rising edge one-shot, and an output to supply the reset signal.

10. The system of claim 9 wherein the beatnote regulator further comprises:

an either edge one-shot having an input connected to the second output of the lock analyzer to accept the interrupt signal, and an output; and an OR gate having a first input connected to the output of the either edge one-shot, a second input connected to the output of the second AND gate, and an output connected to the second input of the counter.

11. The system of claim 10 wherein the lock analyzer further comprises:

a first flip-flop having a clock input connected to the counter output, a reset input connected to the beatnote regulator output, and an output to supply a saved overflow signal;

a divider having a clock input connected to the output of the beatnote regulator, a reset input connected to the output of the first flip-flop, and an output to supply a divided reset signal; and a second flip-flop having a clock input connected to the divider output, a reset input connected to the output of the first flip-flop, and an output to supply the lock signal.

12. The system of claim 11 wherein the lock analyzer divider divides the reset signal by a factor of four.

13. The system of claim 11, wherein the lock analyzer further comprises:

a third flip-flop having a data input connected to the output of the second flip-flop, a clock input connected to the output of the first flip-flop, a reset input, and an output connected to the reset input to supply an interrupt reset signal; and a fourth flip-flop having a clock input connected to the output of the second flip-flop, a reset input connected to the output of the third flip-flop, and an output connected to the second input of the beatnote regulator to supply the interrupt signal.

14. The system of claim 13 wherein the second flip-flop has a first propagation delay for supplying an output responsive to second resetting, the flip-flop;

the system further comprising:

a first delay element with a second propagation delay and an input connected to the output of the first flip-flop, the first delay element having an output connected to the reset input of the divider and the reset input of the second flip-flop; and wherein the third flip-flop has a data input hold-time that is less than the combination of the first and second propagation delays.

15. The system of claim 14 wherein the first flip-flop has a third propagation delay for supplying an output responsive to resetting first the flip-flop; and wherein the divider has a clock pulse processing delay that is less than the combination of the second and third propagation delays.

16. The system of claim 13 wherein the counter further comprises a third input to accept commands selecting the first count; and wherein the lock analyzer supplies a lock signal with a relaxed tolerance of frequency differences between the oscillator and data signals in response to decreasing the value of the first count.

17. The system of claim 16 further comprising:

a first phase detector having a first input to accept the oscillator signal, a second input to accept the data signal, a first output to supply the first beatnote signal, and a second output to supply the second beatnote signal.

18. The system of claim 17 further comprising:

a second phase detector; and a switch having a control input connected to the first output of the lock analyzer and data inputs connected to the first and second phase detector outputs, the switch selecting the second phase detector for use in the system in response to the lock signal, the switch selecting the first phase detector for use in the system in response to the cessation of the lock signal.

* * * * *